(12) United States Patent
Gaspari et al.

(10) Patent No.: US 9,741,882 B2
(45) Date of Patent: Aug. 22, 2017

(54) TANDEM JUNCTION PHOTOVOLTAIC CELL

(71) Applicant: IntriEnergy Inc., Denver, CO (US)

(72) Inventors: Franco Gaspari, Toronto (CA); Anatoli Chkrebtii, Oshawa (CA)

(73) Assignee: IntriEnergy Inc., Denver, CO (US)

( * ) Notice: Subject to any disclaimer, the term of this patent is extended or adjusted under 35 U.S.C. 154(b) by 0 days.

(21) Appl. No.: 14/467,071

(22) Filed: Aug. 25, 2014

(65) Prior Publication Data

US 2016/0056323 A1 Feb. 25, 2016

(51) Int. Cl.
*H01L 31/0687* (2012.01)
*H01L 31/0352* (2006.01)
*H01L 31/076* (2012.01)

(52) U.S. Cl.
CPC .... *H01L 31/035218* (2013.01); *H01L 31/076* (2013.01); *Y02E 10/548* (2013.01)

(58) Field of Classification Search
CPC .................. H01L 31/035218; H01L 31/076
See application file for complete search history.

(56) References Cited

U.S. PATENT DOCUMENTS

| | | | |
|---|---|---|---|
| 8,093,493 B2 | 1/2012 | Cumpston et al. | |
| 8,106,292 B2 | 1/2012 | Cumpston et al. | |
| 8,158,880 B1 | 4/2012 | Girt et al. | |
| 8,383,929 B2 | 2/2013 | Milshtein et al. | |
| 8,642,115 B2 | 2/2014 | Myong | |
| 8,710,361 B2 | 4/2014 | Cumpston et al. | |
| 8,759,670 B2 | 6/2014 | Furusawa | |
| 2004/0079408 A1* | 4/2004 | Fetzer ............... H01L 31/184 136/262 |
| 2006/0144435 A1* | 7/2006 | Wanlass ......... H01L 31/06875 136/249 |
| 2008/0173350 A1* | 7/2008 | Choi ................. H01L 31/18 136/258 |
| 2008/0230120 A1 | 9/2008 | Reddy | |
| 2012/0160298 A1 | 6/2012 | Kanamoto et al. | |

FOREIGN PATENT DOCUMENTS

EP 2453484 A1 5/2012

OTHER PUBLICATIONS

LeMeur, M; International Search Report from corresponding International Patent Application No. PCT/US2015/042419; Nov. 5, 2015, pp. 1-5, European Patent Office as International Searching Authority, Gitschiner Str. 103, D-10958 Berlin, Germany.

(Continued)

*Primary Examiner* — Golam Mowla
(74) *Attorney, Agent, or Firm* — Ballard Spahr LLP

(57) ABSTRACT

A tandem junction photovoltaic cell has a first p-n junction with a first energy band gap, and a second p-n junction with a second energy band gap less than the first energy band gap. The junctions are separated by a quantum tunneling junction. The first p-n junction captures higher energy photons and allows lower energy photons to pass through and be captured by the second p-n junction. Quantum dots positioned within the first p-n junction promote quantum tunneling of charge carriers to increase the current generated by the first p-n junction and match the current of the second p-n junction for greater efficiency.

23 Claims, 3 Drawing Sheets

(56) References Cited

OTHER PUBLICATIONS

LeMeur, M; International Written Opinion from corresponding International Patent Application No PCT/US2015/042419; Nov. 5, 2015, pp. 1-5, European Patent Office as International Searching Authority, Gitschiner Str. 103, D-10958 Berlin, Germany.
Conibeer et al. "Silicon quantum dot nanostructures for tandem photovoltaic cells"; Thin Solid Films, Elsevier-Sequoia S.A. Lausanne, CH, vol. 516, No. 20, Aug. 30, 2008, pp. 6748-6756.
Schnabel et al. "Electrical Properties of Recrystallised SIC Films From PECVD Precursors for Silicon Quantum Dot Solar Cell Applications"; Proceedings/ 26th European Photovoltaic Solar Energy Conference and Exhibition; The Most Inspiring Platform for the Global PV Solar Sector; CCH Congress Centre and International Fair, Hamburg, Germany, Sep. 5, 2011 through Sep. 9, 2011.

* cited by examiner

TANDEM JUNCTION PHOTOVOLTAIC CELL

FIELD OF THE INVENTION

This invention relates to photovoltaic cells and arrays of photovoltaic cells for practical production of electrical power.

BACKGROUND

The quest for increased efficiency of electrical power generation via photovoltaic cells has spawned cells having multiple junctions. For example, tandem junction cells have been developed, wherein two p-n junctions produce electrical current in series from the energy of incident photons. While tandem cells provide an improvement over single junction devices, tandem designs suffer from many of the same limitations as their single junction predecessors. In particular, known tandem junction cells are subject to thermalization losses, as they, like the single junction devices, are not capable of capturing and harnessing the higher energy photons. Furthermore, connection of two p-n junctions in series is subject to poor efficiency when the current output from the two junctions does not match properly. Indeed, the desirable condition is to have the two currents equal in magnitude, since when one is larger than the other, the total current is limited by the smaller of the two. By improving the absorption sequence of the two junctions and the "matching current" conditions, there is clearly an opportunity to improve the performance of tandem photovoltaic cells by taking advantage of the multijunction structure over the single junction design.

SUMMARY

The invention concerns a photovoltaic cell. In one example embodiment, the photovoltaic cell comprises a first p-n junction layer having a first energy band gap between a valence band and a conduction band of the first p-n junction layer and a second p-n junction layer having a second energy band gap between a valence band and a conduction band of the second p-n junction layer. The first energy band gap is greater than the second energy band gap. A tunnel junction layer is positioned between the first and second p-n junctions. A first electrical conductor layer is contiguous with the first p-n junction layer. A second electrical conductor layer is contiguous with the second p-n junction layer.

In a particular example photovoltaic cell according to the invention, the second energy band gap is about 1.1 eV. By way of further example, the first energy band gap is from about 1.5 eV to about 2.3 eV. In a particular example, the first energy band gap is about 1.7 eV.

In an example embodiment, the tunnel junction may comprise a third p-n junction layer. The third p-n junction layer is more heavily doped than the first and second p-n junction layers in this example. In another example embodiment, the tunnel junction layer comprises a transparent metal oxide layer. In specific example embodiments, the transparent metal oxide layer may be selected from the group consisting of titanium oxide, antimony oxide, and combinations thereof.

In another example embodiment, the photovoltaic cell further comprises a plurality of quantum dots positioned within at least the first p-n junction layer. In a specific example embodiment, the quantum dots comprise silicon. By way of example, the quantum dots may have a size from about 1 nm to about 10 nm. Further by way of example, the quantum dots may be disbursed throughout the at least first p-n junction layer at a density up to about $10^{21}$ $cm^{-3}$. In another example embodiment, the quantum dots may be disbursed throughout the at least first p-n junction layer at a density from about $10^8$ $cm^{-2}$ to about $10^{11}$ $cm^{-2}$. By way of example, the quantum dots may be arranged in a three-dimensional array in the at least first p-n junction layer. In another example, the quantum dots are arranged substantially at a surface of the at least first p-n junction layer.

In an example photovoltaic cell according to the invention, the quantum dots are sized and spaced apart from one another within the at least first p-n junction layer so as to promote quantum mechanical tunneling of charge carriers to the first conductor layer.

In a specific example embodiment, the first p-n junction layer may comprise an amorphous silicon. In another example embodiment, the second p-n junction layer may comprise an amorphous silicon. By way of further example, the second p-n junction layer may comprises a crystalline silicon.

In a further example embodiment, the first p-n junction may comprise hydrogenated silicon carbide. In a particular example, the second p-n junction may comprise hydrogenated silicon.

By way of example, at least one of the first and second conductor layers comprise a metal. In a further example, at least the first conductor layer comprises a grid. Also by way of example, the first p-n junction layer comprises an intrinsic layer. Additionally by way of example, the second p-n junction layer comprises an intrinsic layer.

In a practical example, a solar array may be made comprising a plurality of example photovoltaic cells according to the invention.

The invention also encompasses an example photovoltaic cell comprising a first p-n junction layer comprising an n-doped layer and a p-doped layer. The first p-n junction layer has a first energy band gap between a valence band and a conduction band. An electrical conductor layer is contiguous with the n-doped layer of the first p-n junction. A tunnel junction layer is contiguous with the p-doped layer of the first p-n junction. The example further includes a second p-n junction layer comprising an n-doped layer and a p-doped layer. The second p-n junction layer has a second energy band gap between a valence band and a conduction band. The n-doped layer of the second p-n junction is contiguous with the tunnel junction layer. A second electrical conductor layer is contiguous with the p-doped layer of the second p-n junction. In this example embodiment, the first energy band gap is greater than the second energy band gap.

For example, the second energy band gap may be about 1.1 eV and the first energy band gap may be from about 1.5 eV to about 2.3 eV. In a particular example embodiment, the first energy band gap is about 1.7 eV.

Another example embodiment of a photovoltaic cell according to the invention comprises a first p-n junction layer comprising an n-doped layer of hydrogenated silicon carbide and a p-doped layer of hydrogenated silicon carbide. The first p-n junction layer has a first energy band gap between a valence band and a conduction band from about 1.5 eV to about 2.3 eV. An electrical conductor layer is contiguous with the n-doped layer of the first p-n junction. A tunnel junction layer is contiguous with the p-doped layer of the first p-n junction. This example includes a second p-n junction layer comprising an n-doped layer of silicon and a p-doped layer of silicon. The second p-n junction layer has a second energy band gap between a valence band and a conduction band of about 1.1 eV. The n-doped layer of the second p-n junction is contiguous with the tunnel junction layer. A second electrical conductor layer is contiguous with the p-doped layer of the second p-n junction.

By way of example, the second p-n junction layer may comprise a crystalline silicon. By way of further example, the second p-n junction layer may comprise an amorphous silicon. In a specific example embodiment, the first energy band gap is about 1.7 eV.

The invention further encompasses a method of generating electrical power from a plurality of photons having different energies. In one example embodiment, the method comprises:

intercepting photons having energies within a first energy range in a first p-n junction;
generating first charged carriers within the first p-n junction;
collecting the first charged carriers;
allowing photons having energies within a second energy range to pass through the first p-n junction, the second energy range being lower than the first energy range;
intercepting photons having energies within the second energy range in a second p-n junction;
generating second charged carriers within the second p-n junction; and
collecting the second charged carriers.

DETAILED DESCRIPTION

Figure 1:
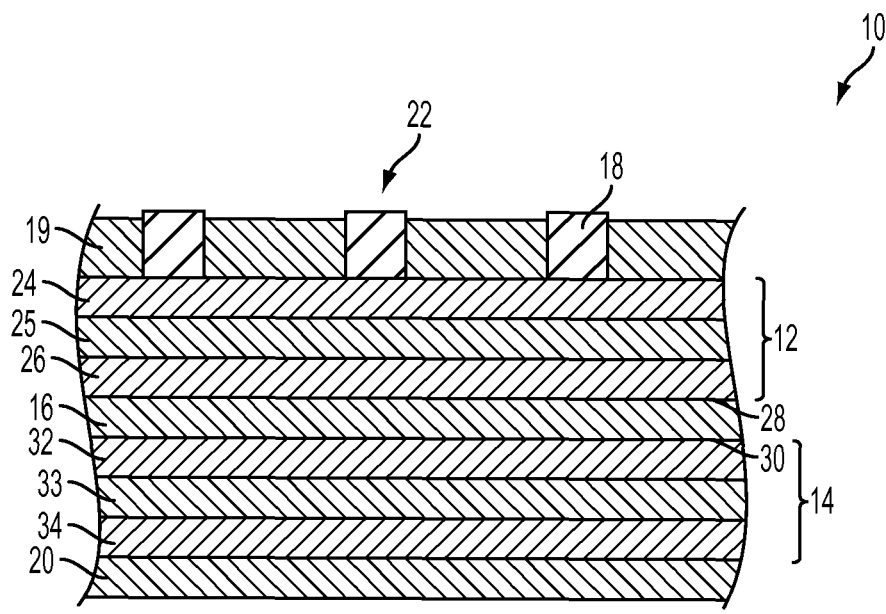
FIG. 1 is a schematic cross sectional view of an example embodiment of a photovoltaic cell according to the invention.

FIG. 1 shows an example photovoltaic cell 10 according to the invention. Cell 10 comprises a first p-n junction layer 12 and a second p-n junction layer 14. A tunnel junction layer 16 is positioned between the first and second p-n junction layers 12 and 14. A first electrical conductor layer 18 is contiguous with the first p-n junction layer 12 and a second electrical conductor layer 20 is contiguous with the second p-n junction layer 14. The first electrical conductor layer is arranged to admit light to the first p-n junction layer and in this example has the form of a grid 22. An optical Anti Reflecting Coating (ARC) 19 can be included contiguous with the first junction 12. Transparent layers such as silicon nitride ($Si_3N_4$) and silicon oxide ($SiO_2$) are commonly used as an ARC. Conductor layers such as 18 and 20 are advantageously formed from metals, such as gold, silver, copper and aluminum.

In the specific example cell shown in FIG. 1 the first p-n junction layer 12 comprises an n-doped layer 24 contiguous with an intrinsic layer 25. Intrinsic layer 25 is an undoped layer grown between the p-doped and n-doped layers of a p-n junction, which provides for the absorption of photons and charged carrier (electrons and holes) creation. Intrinsic layer 25 is contiguous with a p-doped layer 26. The ARC layer 19 is contiguous with the n-doped layer 24, and the first electrical conductor layer 18 (in this example, grid 22) is contiguous with the ARC layer 19. One side 28 of the tunnel junction layer 16 is contiguous with the p-doped layer 26, and the opposite side 30 of the tunnel junction layer is contiguous with an n-doped layer 32 forming the second p-n junction 14. An intrinsic layer 33 is contiguous with the n-doped layer 32, and provides for absorption of photons not absorbed by the junction 12. The intrinsic layer 33 is contiguous with a p-doped layer 34 and the second electrical conductor layer 20 is contiguous with the p-doped layer 34. (Depending on the thicknesses of the p and n doped layers 24, 26, 32 and 34, the photons can be absorbed there as well, not only in the intrinsic layers 25 and 33.)

The tunnel junction layer 16 shown in the example cell 10 advantageously comprises a transparent metal oxide, such as titanium oxide or antimony oxide. Via quantum mechanical tunneling, tunnel junction layer 16 facilitates movement of negative charge carriers (electrons) from the second p-n junction layer 14 to the first p-n junction layer 12 where they can be collected by the first electrical conductor layer 18 to provide power to an electrical circuit (not shown) between the first and second electrical conductor layers 18 and 20. The transparent tunnel junction layer 16 also permits light passing through the first p-n junction layer 12 to enter the second p-n junction layer 14 to generate energy. It is expected that a metal oxide layer having a thickness from about 1 nm to about 100 nm will provide effective tunneling of the negative charge carriers.

Figure 2:
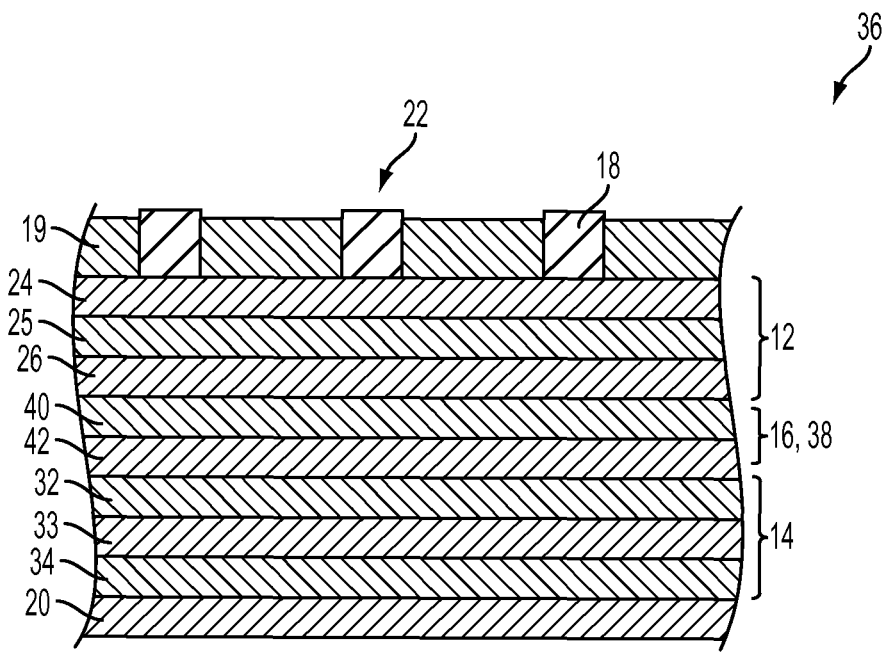
FIG. 2 is a schematic cross sectional view of an example embodiment of a photovoltaic cell according to the invention.

In the example cell embodiment 36 shown in FIG. 2, the tunnel junction layer 16 comprises a thin, heavily doped p-n junction layer 38. The p-n junction layer 38 comprises a p-doped layer 40 contiguous with the p-doped layer 26 of the first p-n junction layer 12, and an n-doped layer 42 contiguous with the n-doped layer 32 of the second p-n junction. It is expected that a p-n junction 38 having a thickness from about 5 nm to about 10 nm and dopant densities from about $10^{20}$ $cm^{-3}$ to about $5\times10^{22}$ $cm^{-3}$ will provide effective quantum mechanical tunneling between the first and second p-n junctions 12 and 14 of the photovoltaic cell embodiment 36 shown in FIG. 2.

Figure 3:
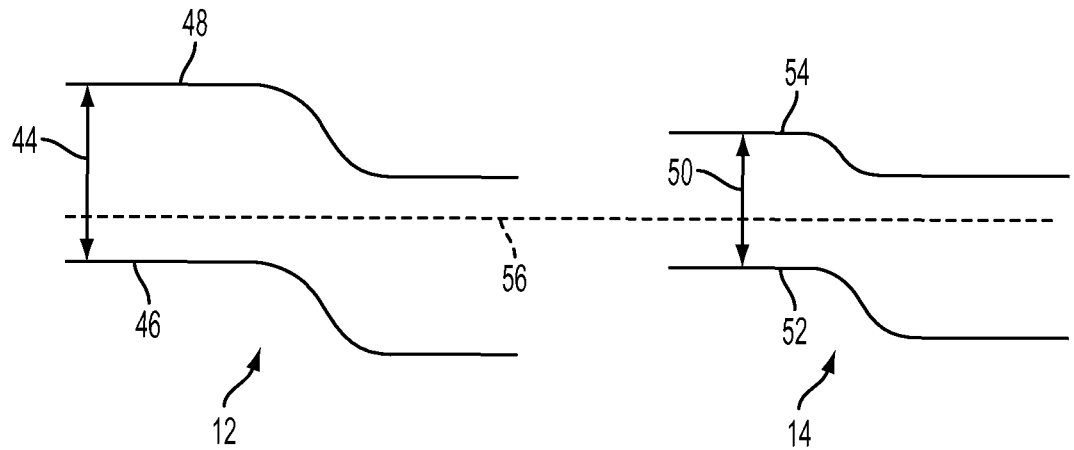
FIG. 3 is a diagram illustrating quantum mechanical energy levels within the semiconductor substrates of the first p-n junction (on the left) and second p-n junction (on the right) of the photovoltaic cells according to the invention.

As shown in FIGS. 1-3, the photovoltaic cells 10 and 36 according to the invention are arranged so that the first p-n junction 12, which initially receives photons incident on the cell, has an energy band gap 44 between the valence band 46 and the conduction band 48 greater than the energy band gap 50 between the valence band 52 and the conduction band 54 of the second p-n junction 14 (the Fermi level being identified by reference character 56). This permits the first p-n junction 12 to capture shorter wavelength photons having greater energy than are captured by the second p-n junction 14, the lower energy photons passing through the first p-n junction 12 and the tunnel junction 16 to be captured by the second p-n junction 14. By capturing photons over a greater range of wavelengths it is expected that photovoltaic cells according to the invention will reduce thermalization losses and generate more power per unit area than photovoltaic cells having a single p-n junction as well as tandem photovoltaic cells wherein both p-n junctions have the same energy band gap.

Calculations predict that a photovoltaic cell having an energy band gap 44 from about 1.5 eV to about 2.3 eV in the first p-n junction, and an energy band gap 50 of about 1.1 eV in the second p-n junction will be advantageous. It is further predicted that a photovoltaic cell having an energy band gap 44 of about 1.7 eV in the first p-n junction, and an energy band gap 50 of about 1.1 eV in the second p-n junction will be particularly efficient.

Arrangement of the desired energy band gaps 44 and 50 in the first and second p-n junctions 12 and 14 is achieved by forming the second p-n junction 14 from crystalline silicon, which has an energy band gap of 1.1 eV, and forming the first p-n junction 12 from an amorphous silicon alloy, such as nonstoichiometric amorphous hydrogenated silicon carbide. It has been found that the band gap of amorphous hydrogenated silicon carbide can be tuned within the desired range of 1.5 eV to 2.3 eV by varying the constituents of the alloy. For example, it is expected that an alloy comprising 55% Si, 15% C and 30% H will yield a silicon carbide alloy having an energy band gap of about 1.5 eV; an alloy comprising 35% Si, 45% C and 20% H is expected to yield a silicon carbide alloy having an energy band gap of about 2.3 eV; and an alloy comprising 40% Si, 30% C and 30% H will yield a silicon carbide alloy having an energy band gap of about 1.7 eV. It is also expected that a photovoltaic cell having a second p-n junction layer 14 of amorphous silicon will be feasible.

In the example photovoltaic cells 10 and 36 disclosed herein, the first and second p-n junctions 12 and 14 will produce electrical current in series with one another. To maximize current generated by the photovoltaic cell, it is necessary that the current generated by the first p-n junction 12 be substantially equal to the current generated by the second p-n junction 14. Otherwise, the p-n junction generating less current will act as a shunt, and the current output of the cell will be reduced. However, the configuration wherein the first p-n junction has a greater energy band gap 44 than the energy band gap 50 of the second p-n junction 14 (see FIG. 3) will naturally result in the first p-n junction 12 producing less current than the second p-n junction 14. This is because the first p-n junction 12 will capture fewer photons (of shorter wavelength and higher energy) than the second p-n junction 14. To help match the current output of the first and second p-n junctions 12 and 14 (and thereby maximize current output) it is advantageous to position quantum dots in the first p-n junction.

Figure 4:
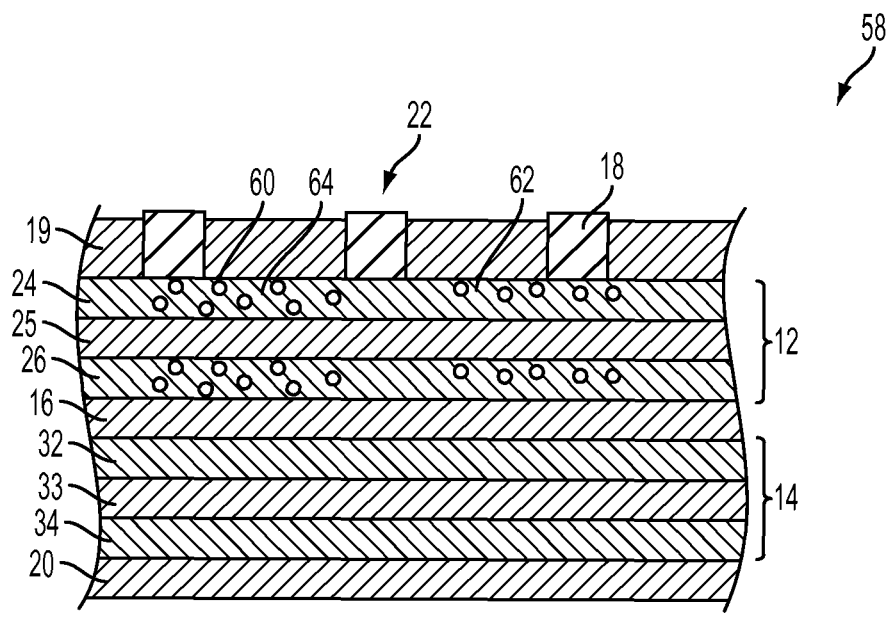
FIG. 4 is a schematic cross sectional view of an example embodiment of a photovoltaic cell according to the invention.

In the example photovoltaic cell embodiment 58 shown in FIG. 4, the n-doped and p-doped layers 24 and 26 of p-n junction 12 comprise quantum dots 60 which are nanocrystal structures formed of semiconductor material. Quantum dots are sized so that they exhibit quantum mechanical behavior, and are used in the voltaic cell 58 to promote quantum mechanical tunneling of charge carriers (electrons and holes). The quantum dots 60 may advantageously comprise silicon, precipitated out during the formation of the p and n doped layers 24 and 26 using silicon rich silicon oxides or nitrides, wherein it is known that annealing will cause the extra silicon (in excess of the stoichiometric requirements) to precipitate into quantum dots, the size of the dots being dependent upon the annealing temperature and duration. It is expected that quantum dots 60 having a size range from about 1 nm to about 10 nm will be advantageous for use in photovoltaic cells according to the invention.

Quantum dots may also be formed of binary compounds such as cadmium selenide, cadmium sulfide, indium arsenide, and indium phosphide. Quantum dots may also be made from ternary compounds such as cadmium selenide sulfide. Quantum dots can contain as few as 100 to 100,000 atoms within the quantum dot volume, with a diameter of 10 to 50 atoms. This corresponds to about 2 to 10 nanometers, and at 10 nm in diameter, nearly 3 million quantum dots could be lined up end to end and fit within the width of a human thumb.

Some quantum dots are small regions of one material buried in another with a larger band gap. These can be so-called core-shell structures, e.g., with cadmium selenide in the core and zinc sulfide in the shell or from special forms of silica called ormosil. Individual quantum dots can be created from two-dimensional electron or hole gases present in remotely doped quantum wells or semiconductor heterostructures called lateral quantum dots. The sample surface is coated with a thin layer of resist. A lateral pattern is then defined in the resist by electron beam lithography. This pattern can then be transferred to the electron or hole gas by etching, or by depositing metal electrodes (lift-off process) that allow the application of external voltages between the electron gas and the electrodes.

It is further expected that quantum dots 60 being distributed throughout the n-doped and p-doped layers 24 and 26 at a volume density up to $10^{21}$ cm$^{-3}$, or an areal (surface) density from about $10^8$ cm$^{-2}$ to about $10^{11}$ cm$^{-2}$ will be advantageous. The quantum dots 60 may be substantially spherical or pyramidal (other shapes are also feasible), and may be distributed substantially at the surface of the n-doped and p-doped layers 24 and 26 as shown at 62, or throughout the volume of the layers in a three dimensional array 64.

The size of the quantum dots 60, their density (areal and volumetric) and spacing from one another are parameters that are coordinated to "tune" the n-doped and p-doped layers 24 and 26 so as to provide effective quantum mechanical tunneling of charge carriers energized by incident photons to the conductor layer 18 to increase the current produced by p-n junction 12 having the higher energy band gap. Appropriate tuning of the arrangement and size of the quantum dots 60 will allow hitherto unusable charge carriers having energies in excess of the conduction band of the semiconductor substrates forming the voltaic cell 10 to be harnessed for work, thereby increasing the current from p-n junction 12 to better match the current from p-n junction 14 having the lower energy band gap.

Figure 5:
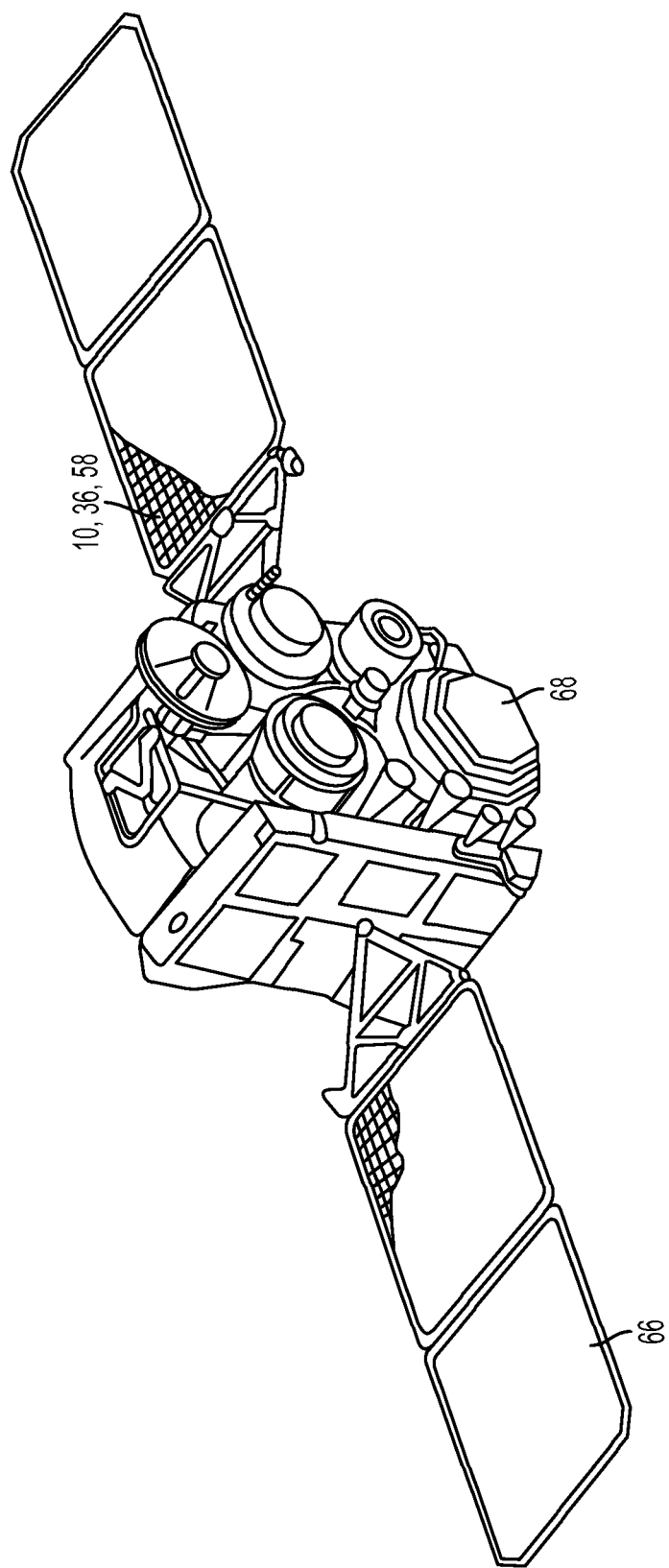
FIG. 5 is an isometric view of a photovoltaic array comprising example photovoltaic cells according to the invention.

Pluralities of photovoltaic cells according to the invention, such as the example embodiments 10 (FIG. 1), 36 (FIG. 2) and 58 (FIG. 4), may be combined into arrays 66 as shown in FIG. 5 and produce electrical power for practical applications, such as powering an artificial satellite 68, or supplying power to an electrical grid. It is expected that photovoltaic cells according to the invention will operate more efficiently than prior art cells, thus enabling smaller arrays to replace larger arrays of equivalent power for example.

A practical example of a photovoltaic cell according to the invention is expected to produce about 65 Watts/m$^2$ of electrical power, assuming a daily average irradiance for the Earth of approximately 250 W/m$^2$, the cells having the following characteristics:

Semiconductor materials: crystalline silicon, or amorphous silicon second p-n junction 14, hydrogenated silicon carbide first p-n junction 12, heavily doped p-n silicon junction for tunnel junction, or antimony oxide, titanium oxide, and other metal oxides. Second p-n junction bandgap (1.0 to 1.3 eV), first p-n junction bandgap (1.6 to 2.2 eV). Quantum dot distribution throughout the n-doped and p-doped layers 24 and 26 at a volume density up to $10^{21}$ cm$^{-3}$, or an areal (surface) density from about $10^8$ cm$^{-2}$ to about $10^{11}$ cm$^{-2}$.

Photovoltaic cells according to the invention are expected to yield an increased efficiency of about 5% over known prior art photovoltaic cells.

What is claimed is:

1. A photovoltaic cell, comprising:
   a first p-n junction layer having a first energy band gap between a valence band and a conduction band of said first p-n junction layer;
   a second p-n junction layer having a second energy band gap between a valence band and a conduction band of said second p-n junction layer, said first energy band gap being greater than said second energy band gap;
   a tunnel junction layer positioned between said first and second p-n junctions;
   a plurality of quantum dots having a distribution confined to a surface of an n-doped layer and/or a p-doped layer of at least said first p-n junction layer;
   a first electrical conductor layer contiguous with said first p-n junction layer; and
   a second electrical conductor layer contiguous with said second p-n junction layer.

2. The photovoltaic cell according to claim 1, wherein said second energy band gap is about 1.1 eV.

3. The photovoltaic cell according to claim 2, wherein said first energy band gap is from about 1.5 eV to about 2.3 eV.

4. The photovoltaic cell according to claim 2, wherein said first energy band gap is about 1.7 eV.

5. The photovoltaic cell according to claim 1, wherein said tunnel junction comprises a third p-n junction layer.

6. The photovoltaic cell according to claim 5, wherein said third p-n junction layer is more heavily doped than said first and second p-n junction layers.

7. The photovoltaic cell according to claim 1, wherein said tunnel junction layer comprises a transparent metal oxide layer.

8. The photovoltaic cell according to claim 7, wherein said transparent metal oxide layer is selected from the group consisting of titanium oxide, antimony oxide, and combinations thereof.

9. The photovoltaic cell according to claim 1, wherein said quantum dots comprise silicon.

10. The photovoltaic cell according to claim 1, wherein said quantum dots have a size from about 1 nm to about 10 nm.

11. The photovoltaic cell according to claim 1, wherein said quantum dots are disbursed throughout said at least first p-n junction layer at a density from about $10^8$ cm$^{-2}$ to about $10^{11}$ cm$^{-2}$.

12. The photovoltaic cell according to claim 1, wherein said quantum dots are sized and spaced apart from one another within said at least first p-n junction layer so as to promote quantum mechanical tunneling of charge carriers to said first conductor layer.

13. The photovoltaic cell according to claim 1, wherein said first p-n junction layer comprises an amorphous silicon.

14. The photovoltaic cell according to claim 13, wherein said second p-n junction layer comprises an amorphous silicon.

15. The photovoltaic cell according to claim 13, wherein said second p-n junction layer comprises a crystalline silicon.

16. The photovoltaic cell according to claim 1, wherein said first p-n junction comprises hydrogenated silicon carbide.

17. The photovoltaic cell according to claim 16, wherein said second p-n junction comprises hydrogenated silicon.

18. The photovoltaic cell according to claim 1, wherein at least one of said first and second conductor layers comprise a metal.

19. The photovoltaic cell according to claim 18, wherein at least said first conductor layer comprises a grid.

20. The photovoltaic cell according to claim 1, wherein said first p-n junction layer comprises an intrinsic layer.

21. The photovoltaic cell according to claim 1, wherein said second p-n junction layer comprises an intrinsic layer.

22. A solar array comprising a plurality of photovoltaic cells according to claim 1.

23. A method of generating electrical power from a plurality of photons having different energies, said method comprising:
   intercepting photons having energies within a first energy range in a first p-n junction;
   generating first charged carriers within said first p-n junction;
   collecting said first charged carriers using a plurality of quantum dots having a distribution confined to a surface of an n-doped and or a p-doped layer of said first p-n junction;
   allowing photons having energies within a second energy range to pass through said first p-n junction, said second energy range being lower than said first energy range;
   intercepting photons having energies within said second energy range in a second p-n junction;
   generating second charged carriers within said second p-n junction; and
   collecting said second charged carriers using a plurality of quantum dots having a distribution confined to a surface of an n-doped and or a p-doped layer of said second p-n junction.

* * * * *